(12) United States Patent
Mao et al.

(10) Patent No.: US 9,663,357 B2
(45) Date of Patent: May 30, 2017

(54) OPEN CAVITY PACKAGE USING CHIP-EMBEDDING TECHNOLOGY

(71) Applicant: Texas Instruments Incorporated, Dallas, TX (US)

(72) Inventors: Jie Mao, San Jose, CA (US); Hau Nguyen, San Jose, CA (US); Luu Nguyen, San Jose, CA (US); Anindya Poddar, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/963,362

(22) Filed: Dec. 9, 2015

(65) Prior Publication Data
US 2017/0015548 A1   Jan. 19, 2017

Related U.S. Application Data

(60) Provisional application No. 62/192,660, filed on Jul. 15, 2015.

(51) Int. Cl.
| | |
|---|---|
| *H01L 21/683* | (2006.01) |
| *B81C 1/00* | (2006.01) |
| *B81B 7/00* | (2006.01) |

(52) U.S. Cl.
CPC .......... *B81C 1/00873* (2013.01); *B81B 7/007* (2013.01); *H01L 21/6836* (2013.01); *B81B 2201/0214* (2013.01); *B81B 2201/0235* (2013.01); *B81B 2201/0257* (2013.01); *B81B 2201/0264* (2013.01);
(Continued)

(58) Field of Classification Search
CPC ....... H01L 21/6836; H01L 2221/68318; H01L 2221/68322; H01L 2221/68327; H01L 2221/68345; H01L 2221/68354
See application file for complete search history.

(56) References Cited

U.S. PATENT DOCUMENTS 6,550,337 B1 * 4/2003 Wagner ................. G01L 9/0042
73/715
8,609,539 B2 * 12/2013 Kondo ................ H01L 21/6835
438/614

(Continued)

FOREIGN PATENT DOCUMENTS

WO    WO0038231    6/2000

*Primary Examiner* — Earl Taylor
(74) *Attorney, Agent, or Firm* — Jacqueline J. Garner; Charles A. Brill; Frank D. Cimino

(57) ABSTRACT

A method for fabricating packaged semiconductor devices (100) with an open cavity (110a) in panel format; placing (process 201) on an adhesive carrier tape a panel-sized grid of metallic pieces having a flat pad (230) and symmetrically placed vertical pillars (231); attaching (process 202) semiconductor chips (101) with sensor systems face-down onto the tape; laminating (process 203) and thinning (process 204) low CTE insulating material (234) to fill gaps between chips and grid; turning over (process 205) assembly to remove tape; plasma-cleaning assembly front side, sputtering and patterning (process 206) uniform metal layer across assembly and optionally plating (process 209) metal layer to form rerouting traces and extended contact pads for assembly; laminating (process 212) insulating stiffener across panel; opening (process 213) cavities in stiffener to access the sensor system; and singulating (process 214) packaged devices by cutting metallic pieces.

20 Claims, 7 Drawing Sheets

(52) U.S. Cl.
CPC ............. *B81B 2201/0278* (2013.01); *B81B 2201/0292* (2013.01); *B81B 2201/047* (2013.01); *B81B 2207/07* (2013.01); *B81B 2207/098* (2013.01); *B81C 2201/0125* (2013.01); *B81C 2201/0132* (2013.01); *B81C 2201/0159* (2013.01); *B81C 2201/0181* (2013.01); *B81C 2201/0188* (2013.01); *B81C 2203/0136* (2013.01)

(56) References Cited

U.S. PATENT DOCUMENTS

| | | | |
|---|---|---|---|
| 8,866,237 B2* | 10/2014 | Manack | B81C 1/00246 257/414 |
| 2003/0170933 A1 | 9/2003 | Manansala | |
| 2005/0236644 A1 | 10/2005 | Getten et al. | |
| 2006/0121718 A1* | 6/2006 | Machida | H01L 23/5389 438/612 |
| 2006/0216854 A1* | 9/2006 | Nishikawa | H01L 23/5389 438/106 |
| 2009/0057885 A1* | 3/2009 | Theuss | B81C 1/0023 257/723 |
| 2013/0049205 A1* | 2/2013 | Meyer | H01L 23/3107 257/773 |
| 2013/0221452 A1* | 8/2013 | Strothmann | H01L 24/19 257/414 |
| 2013/0221455 A1* | 8/2013 | Manack | B81C 1/00246 257/416 |
| 2013/0307147 A1* | 11/2013 | Liu | H01L 21/76898 257/737 |
| 2014/0346623 A1 | 11/2014 | Elian et al. | |

\* cited by examiner

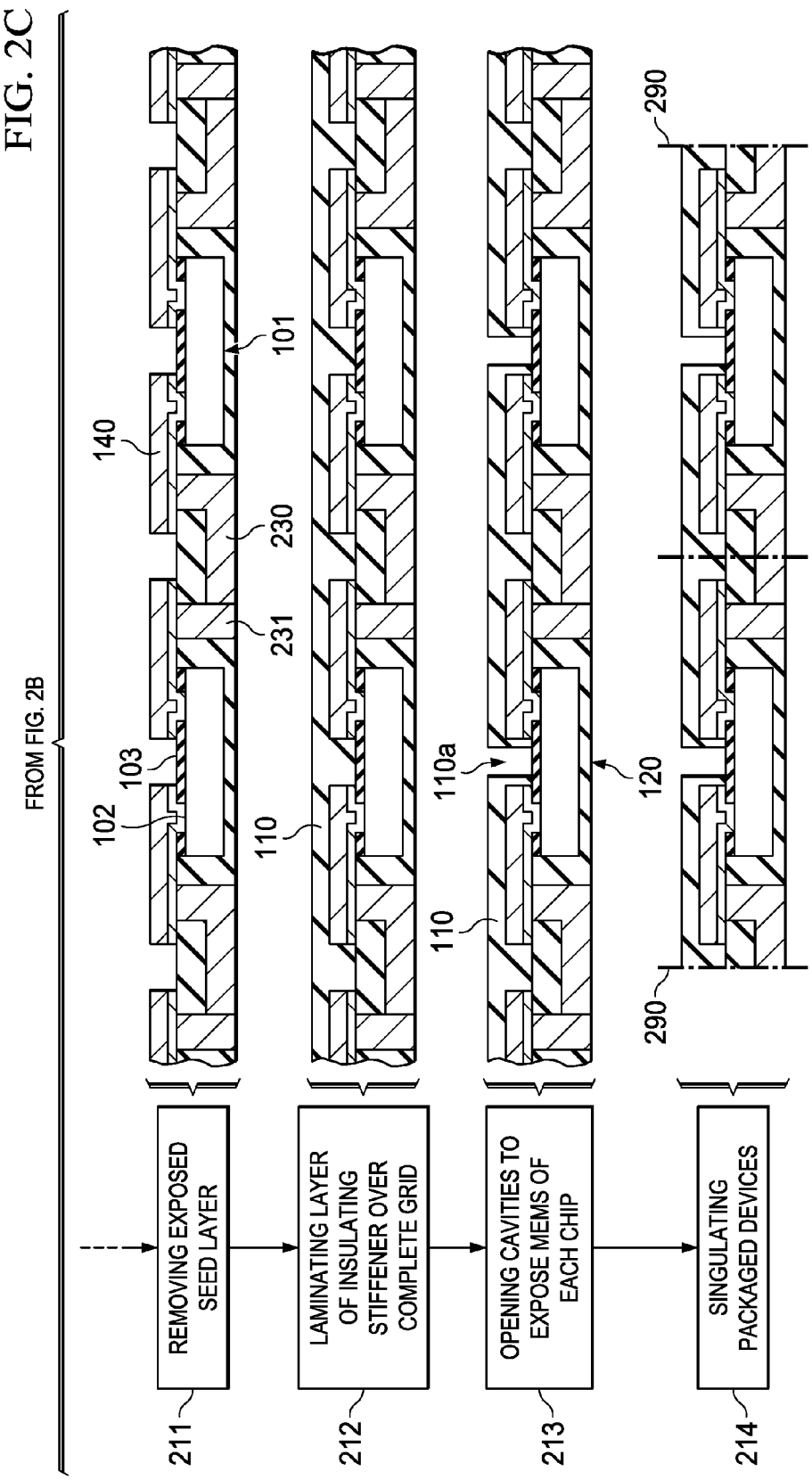

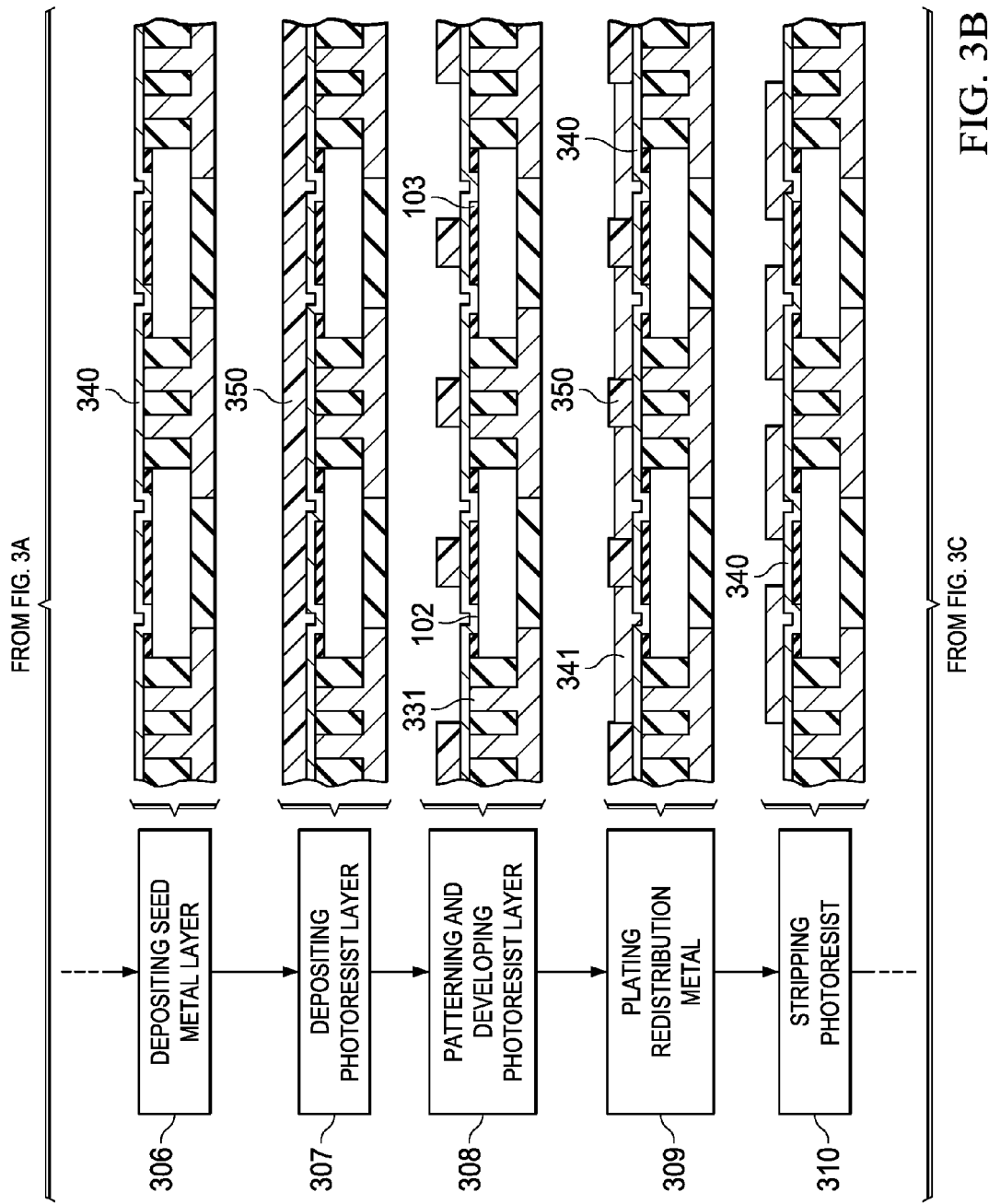

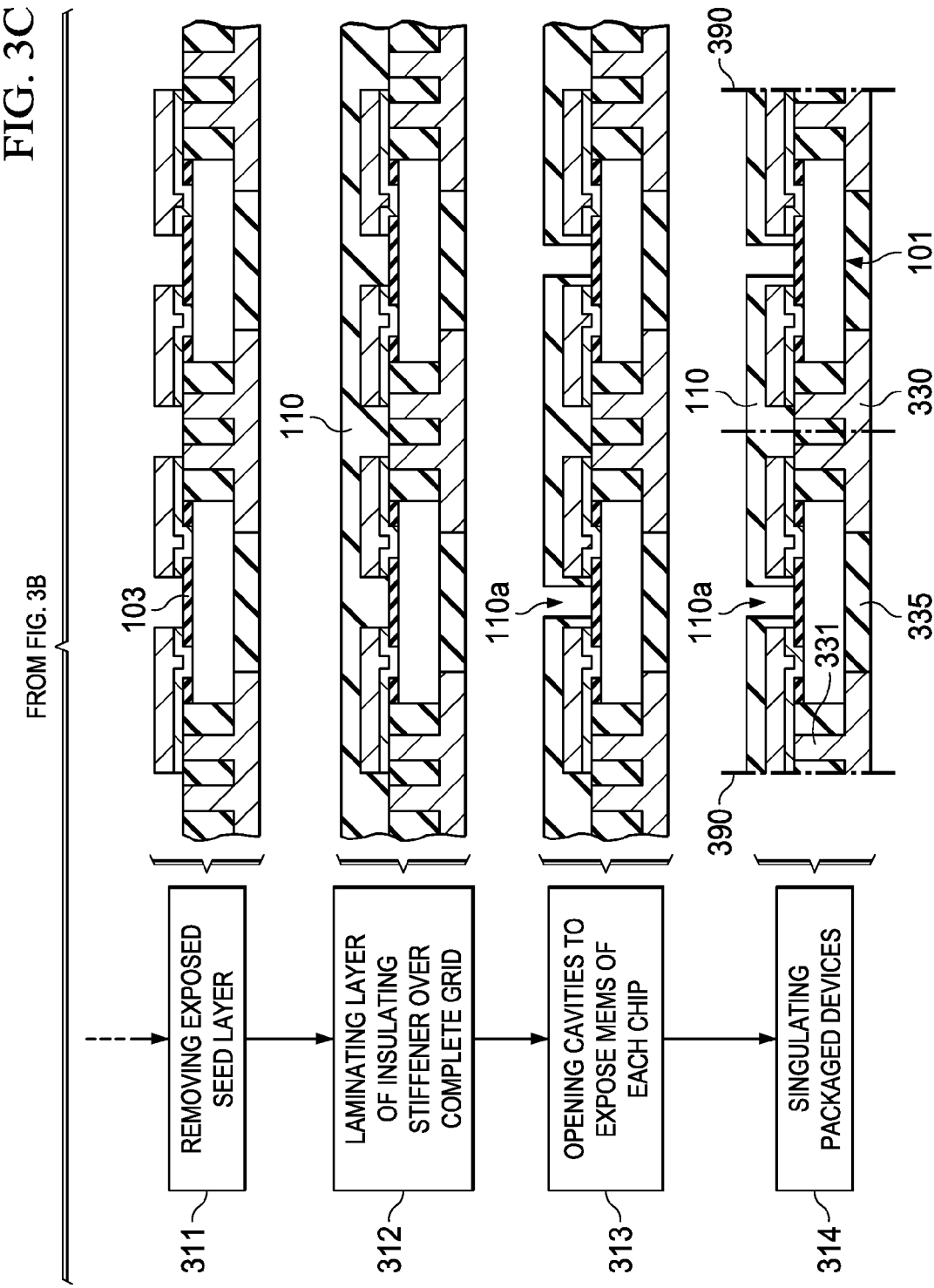

OPEN CAVITY PACKAGE USING CHIP-EMBEDDING TECHNOLOGY

CROSS REFERENCE TO RELATED APPLICATIONS

This application claims the benefit of Provisional Application Ser. No. 62/192,660 entitled "Open Cavity QFN Package Using Silicon Embedding Technology", filed Jul. 15, 2015, which is herein incorporated by reference in its entirety.

FIELD

Embodiments of the invention are related in general to the field of semiconductor devices and processes, and more specifically to the structure and fabrication method of semiconductor open cavity packages.

DESCRIPTION OF RELATED ART

In conventional technology, semiconductor humidity sensors are fabricated using open-cavity molded packages to expose the sensing area on the semiconductor chip. In existing technology, open cavity packages require film-assisted molding equipment, which are precision-machined expensive mold chases dedicated for each package design. Consequently, every time a package with new form factors is to be introduced, a bow wave of costly tooling expenditures needs to be absorbed.

The wide variety of products collectively called Micro-Electro-Mechanical devices (MEMS) are small, low weight devices on the micrometer to millimeter scale, which may have mechanically moving parts and often movable electrical power supplies and controls, or they may have parts sensitive to humidity, or to thermal, acoustic, or optical energy. MEMS have been developed to sense environmental, mechanical, thermal, chemical, radiant, magnetic, and biological quantities and inputs, and produce signals as outputs. Because of the moving and sensitive parts, MEMS have a need for physical and atmospheric protection. Consequently, MEMS are placed on a substrate and have to be surrounded by a housing or package, which has to shield the MEMS against ambient and electrical disturbances, and against stress.

A Micro-Electro-Mechanical System (MEMS) integrates mechanical elements, sensors, actuators, and electronics on a common substrate. The manufacturing approach of a MEMS aims at using batch fabrication techniques similar to those used for microelectronics devices. MEMS can thus benefit from mass production and minimized material consumption to lower the manufacturing cost, while trying to exploit the well-controlled integrated circuit technology.

Following the technology trends of miniaturization, integration and cost reduction, substrates, boards, and processes have recently been developed which can embed and interconnect chips and packages in order to reduce board space, thickness, and footprint while increasing power management, electrical performance, and fields of application. Examples include penetration of integrated boards into the automotive market, wireless products, and industrial applications. An example of a MEMS device such as an infra-red radiation sensor embedded in a miniaturized board as part of a larger integrated system has recently been described in U.S. Pat. No. 8,866,237, issued on Oct. 21, 2014 (Manack et al., "Methods for Embedding Controlled-Cavity MEMS Package in Integrated Board").

It is common practice to manufacture the active and passive components of semiconductor devices into round wafers sliced from elongated cylinder-shaped single crystals of semiconductor elements, such as silicon, or compounds, such as gallium nitride. From the round wafers, individual devices are typically singulated by sawing streets in x- and y-directions through the wafer in order to create rectangularly shaped discrete pieces from the wafers, commonly referred to as die or chips. After processing, each chip includes at least one device coupled with respective metallic contact pads, ranging up to integrated circuits with more than a million active and passive components.

After singulation, one or more chips are attached to a discrete supporting substrate such as a metal leadframe or a rigid multi-level substrate laminated from a plurality of metallic and insulating layers. The conductive traces of the leadframes and substrates are then connected to the chip contact pads, typically using bonding wires or metal bumps such as solder balls. For reasons of protection against environmental and handling hazards, the assembled chips may be encapsulated in discrete robust packages, which frequently employ hardened polymeric compounds and are formed by techniques such as transfer molding. The assembly and packaging processes are usually performed either on an individual basis or in small groupings such as a strip of leadframe or a loading of a mold press.

Processes have recently been investigated to increase the volume handled by each packaging process by employing large-scale panels for creating package structures. The methodology aims at avoiding panel warpage, mechanical instability, and expensive laser operations, while achieving low resistance connections and improved thermal characteristics. For metallic seed layers, uniformity of the layers across the selected panel size is achieved by a sputtering technology with plasma-cleaned and cooled panels, which produces uniform sputtered metal layers across a panel and thus avoids the need for electroless plating. The proposed methodology uses adhesive tapes instead of epoxy chip attach procedures, and is free of the need to use lasers. In addition, the packaged devices offer improved reliability due to reduced thermo-mechanical stress achieved by laminating gaps with insulating fillers having high modulus and a glass transition temperature for a coefficient of thermal expansion approaching the coefficient of silicon.

SUMMARY

Changes for semiconductor device packages which use a cavity molding process to fabricate device-specific packages are time-consuming and expensive because they involve expensive precision molds. Applicants realized that in semiconductor technology a piece part such as a pre-fabricated package can be avoided without sacrificing the encapsulation function, when a fabrication process flow can be developed so that the package evolves step by step along with the embedding procedure of the chip. Such generic embedding packaging processes are particularly welcome for semiconductor devices, which involve sensor systems and micro-electro-mechanical systems (MEMS), since MEMS devices are generally earmarked to be adjustable to a wide variety of applications.

Applicants realized that for a sensor or MEMS to operate in an immersed location in an integration board, the integration would need to allow an unobstructed access of the physical entity-to-be-monitored to the sensor or MEMS; the integration board has to leave a window for light, sound, gas, moisture, etc. to transmit through. In the example of a humidity sensor, the atmosphere would need unobstructed access to the humidity sensor located in a cavity; this means the cavity must have a controlled opening to the ambient.

An embodiment of the invention is a method for fabricating packaged semiconductor devices with an open cavity in panel format. In the method, a panel-sized grid of metallic pieces with a flat pad and symmetrically placed vertical pillars is placed on an adhesive carrier tape. Semiconductor chips with sensor systems or MEMS are placed face-down onto the tape. The next processes involve laminating, curing, and thinning a low CTE plastic insulating material to fill the gaps between chips and grid. Then, the assembly is turned over to remove the carrier tape. The now exposed assembly front side is plasma cleaned and a uniform metal layer is sputtered and patterned across the assembly to form rerouting traces and extended contact pads for assembly; optionally a metal layer may be plated. Then, an insulating stiffener is laminated across the panel. Cavities are opened in the stiffener to access the sensor system or MEMS. Finally, packaged devices are singulated by cutting the metallic pieces into halves.

BRIEF DESCRIPTION OF THE DRAWINGS

FIG. 2C displays additional processes of the fabrication flow started in FIG. 2A to embed chips with sensor systems in packages.

FIG. 3B displays additional processes of the fabrication flow started in FIG. 3A to embed chips with sensor systems in packages.

FIG. 3C shows additional processes of the fabrication flow started in FIG. 3A to embed chips with sensor systems in packages.

DETAILED DESCRIPTION OF THE PREFERRED EMBODIMENTS

Figure 1:
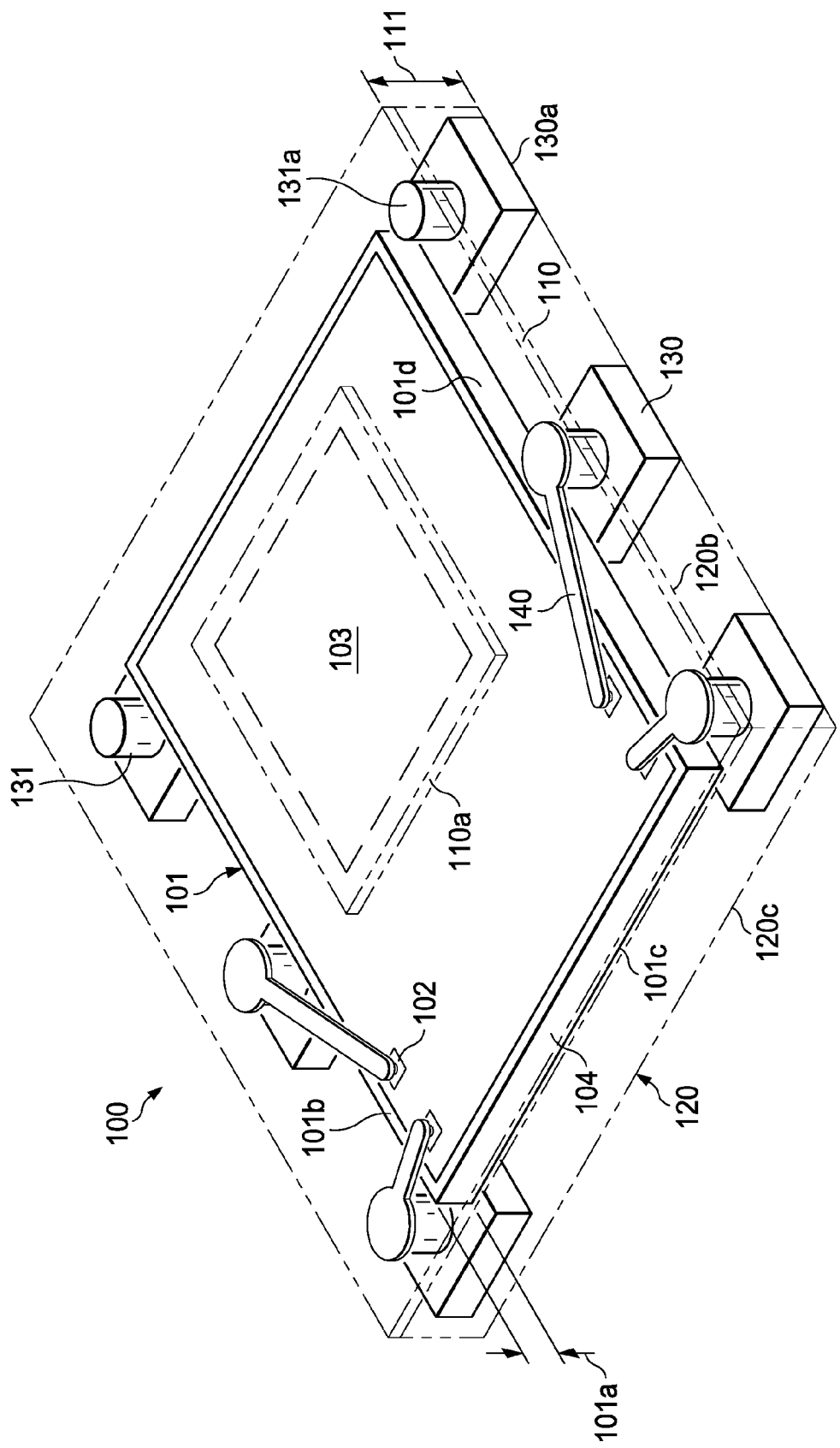
FIG. 1 illustrates a perspective view of a semiconductor devices having a chip with a sensor system or micro-electro-mechanical system (MEMS) embedded in a package with an opening to access the system.

FIG. 1 illustrates an exemplary embodiment, a semiconductor device generally designated 100 having a semiconductor chip 101 with terminals 102. Chip 101 is embedded in a package, which has been fabricated with an opening or cavity 110 in the protective insulating stiffener 110 covering chip surface 101b. As illustrated in detail below, while the chip is being embedded in a process flow suitable for executing the sequence of processes in panel form.

As defined herein, the expression panel refers to a housing, or package, with a composition to embed semiconductor chips within the emerging package to produce an integrated device, and further implies large lateral dimensions suitable to execute the process steps as batch processes, thereby allowing drastically reduced fabrication costs compared to conventional fabrication techniques. In the exemplary device, an open cavity panel-fabricated package is compared with standard plastic molded cavity packages. As an example for panels, panels may have square or rectangular shape and reach sizes of 20" by 20" to 28" by 28", or larger; panels may be suitable for attaching a plurality of semiconductor whole wafers (for example four wafers of 12" diameter), or a plurality of semiconductor chips.

Semiconductor chip 101 has a first height 101a, sidewalls 101d, and a first surface 101b, which includes a micro-electro-mechanical system (MEMS) 103 with metallized terminals 102. Chip 101 further has a second surface 101c, which parallel to first surface 101b, and sidewalls 104.

The MEMS may be selected from a group including sensors of environmental, mechanical, thermal, chemical, radiant, magnetic and biological quantities and input. As an example, the MEMS may be a humidity sensor. In other devices, the MEMS may include sensors of electro-magnetic radiation such as visible or infrared light, or sensors requiring membranes. An exemplary chip suitable as a humidity-sensing MEMS may be square-shaped with a side length of about 2 mm; the footprint of exemplary device 100 may be 2.33×2.28 mm (compared to 3.0 mm of conventional molded devices). The overall height 111 of the package of device 100 is 0.29 mm (compared to 0.75 mm of conventional molded devices).

As FIG. 1 shows, chip 101 is surrounded and encapsulated by a container 120, which is made of compliant insulating polymeric material. The base material and the fillers are selected to have a coefficient of thermal expansion approaching the coefficient of the semiconductor chip. The polymeric material of container 120 covers and adheres to the second surface (bottom surface) 101c and to the sidewalls 101d of chip 101. Container 120 has a planar top surface 120b (referred to as the third surface) and a parallel bottom surface 120c (referred to as the fourth surface). Third surface 120b is coplanar with first surface 101b.

FIG. 1 further illustrates that a plurality of metallic pads 130 is inserted into the insulating polymeric material 120. Pads 130 have an outer surface 130a, which is coplanar with fourth surface 120c. In addition, outer pad surface 130a may have preferably a metallurgical composition suitable for soldering. On the inside, pads 130 have a vertical entity such as a pillar, a cube, or a hexahedron 131. The pillar, or the hexahedron, has a surface 131a parallel to outer surface 130a. The surface of the pillar enhances the adhesion to the polymeric material of container 120. Surface 131a of pillar 131 is in contact with conductive redistribution traces 140, which connect pads 130 to respective terminals 102 of chip 101 and MEMS 103.

FIG. 1 shows that the first surface 101b of chip 101, the coplanar top (third) surface 120b of the container, and the redistribution traces 140 are protected by a flat layer 110 of insulating stiffener, which is preferably made of a material such as solder mask. Layer 110 leaves open cavity 110a so that the MEMS is exposed to the entity to be sensed. For instance, cavity 110a is constructed to allow exposure of the MEMS to humidity for devices where the MEMS includes a humidity sensor. In other devices, the MEMS may be selected from a group including sensors of environmental, mechanical, thermal, chemical, radiant, magnetic and biological quantities and inputs.

Figure 2A:
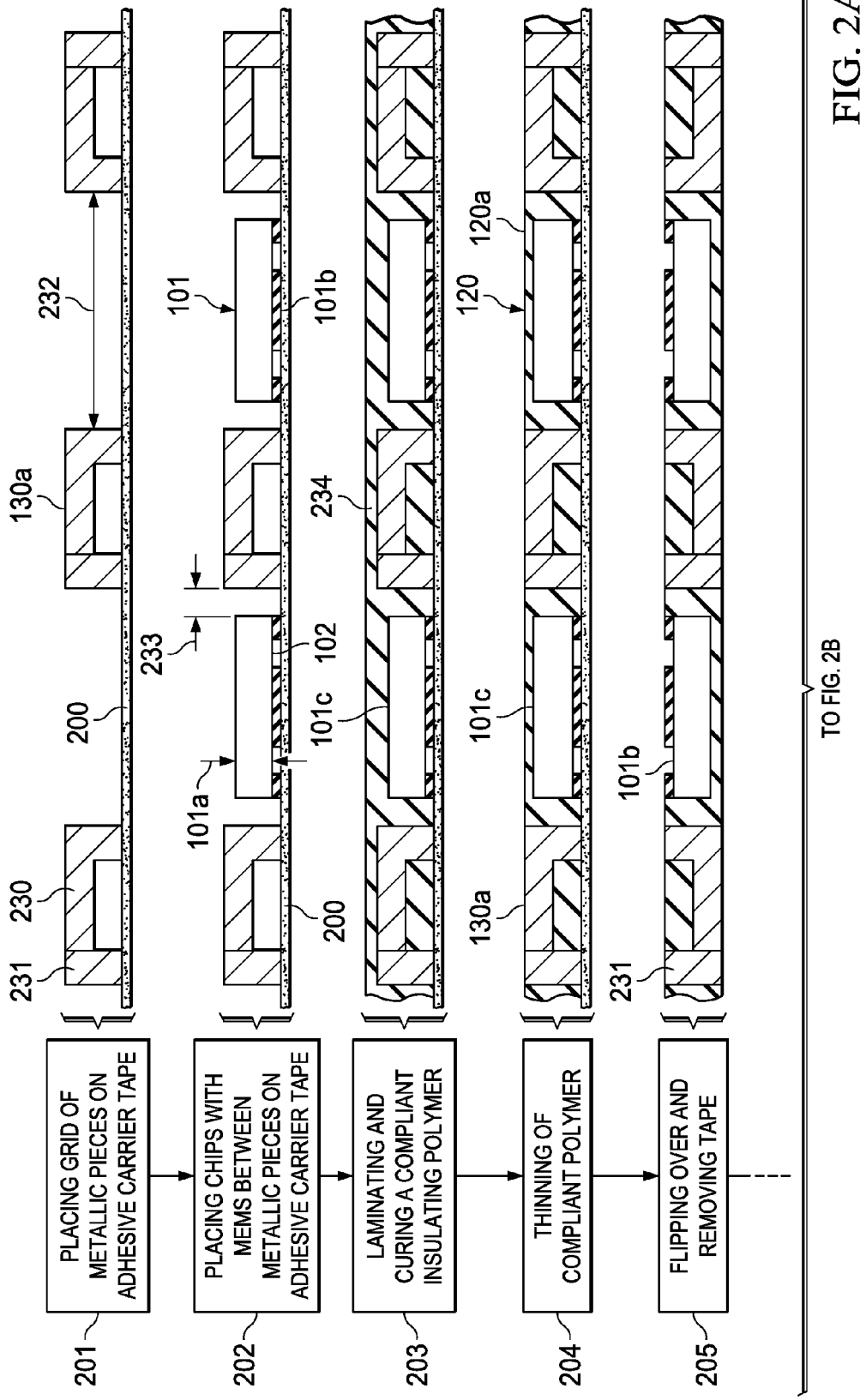
FIG. 2A depicts certain processes of the fabrication flow to embed semiconductor chips with sensor systems or micro-electro-mechanical systems (MEMS) in encapsulating packages having a cavity for accessing the system.
Figure 2B:
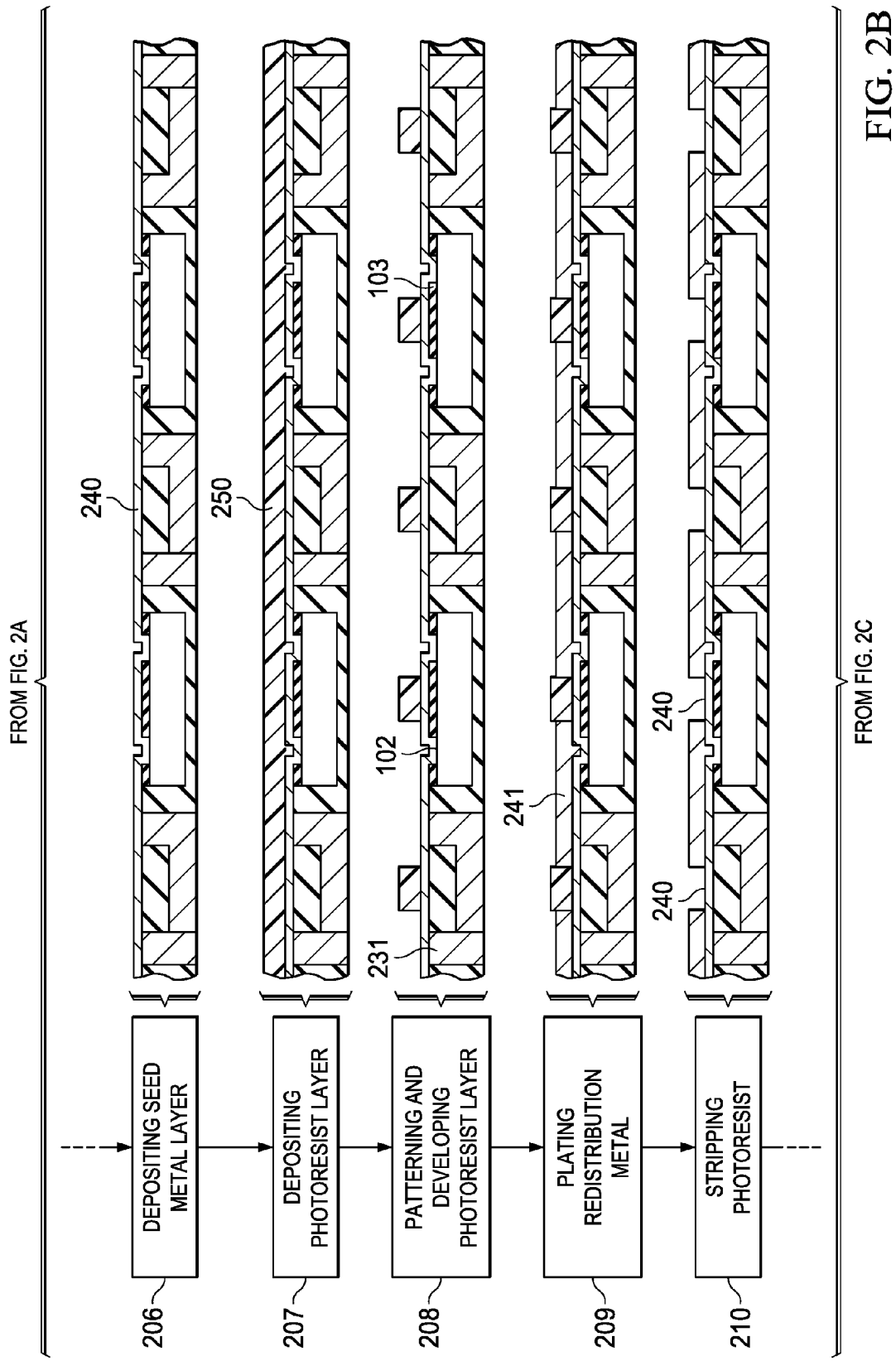
FIG. 2B shows additional processes of the fabrication flow started in FIG. 2A to embed chips with sensor systems in packages.

Another embodiment of the invention is a method for fabricating in panel format open cavity packages with embedded semiconductor chips. A flow of processes in this fabrication method is illustrated in FIGS. 2A, 2B, and 2C. Another method is depicted in the process flow of FIGS. 3A, 3B, and 3C.

The method shown in FIGS. 2A, 2B, and 2C starts by providing a plurality of semiconductor chips 101, which have a first height 101a and a first surface 101b. First surface 101b includes a micro-electro-mechanical system (MEMS) 103 and a plurality of terminals 102.

Furthermore, a plurality of metallic pieces is provided, which are preferably made of copper. These pieces are shaped so that they have a flat pad and one or more vertical entities 131 such as pillars or hexahedrons positioned symmetrical relative to the pad center. The pad center itself needs to stay clear of vertical entities, since in a later process (see below process 214, package singulation) the piece will be cut into two half portions designated 130. Each half portion has to retain a vertical entity and is referred to herein as member. After singulation, the exemplary member of the device shown in FIG. 1 includes pillar 131 positioned in the center of pad 130; in other members, such as the exemplary device shown in FIG. 2A, a hexahedron 231 is positioned at the perimeter of pad 230. The outer surface 130a of the members, i.e. the surface opposite the pillars, is preferably solderable. The height of a member, including the thickness pad 230 and the height of hexahedron 231, is referred to as second height; it is greater than the first height 101a.

In process 201 (see FIG. 2A), an adhesive tape 200 is provided and a metallic grid is formed on the tape using a plurality of the metallic pieces. The pieces are placed with their pillars 231 on the adhesive carrier tape 200 in orderly rows and columns to form a regular grid. The finished grid covers a whole area of the tape; the pieces are spaced by openings 232, which are sized to accommodate semiconductor chips.

Rather than placing individual metallic pieces, it may be more practical to use alternative methods for creating the grid of metallic pieces. One method for fabricating the grid is to provide a window frame of a sheet metal, which may have one solderable surface, and then to form the array of pieces with pads and pillars by stamping or etching.

In the next process 202, a chip 101 is placed inside a respective opening 232 between two adjacent metallic pieces so that the first surface 101b of the chip with the MEMS and the terminals is facing downward and is adhered to the tacky surface of tape 200. After the chip attachment, the chips are framed by the metallic pieces while the chip sidewalls are spaced by gaps 233 from adjacent sidewalls, or hexahedrons, of the metallic pieces.

In the next process 203, a compliant insulating polymer 234 is laminated, under vacuum suction, to cohesively fill the gaps 233 between chip and piece sidewalls, and to cover the chip surface 101c facing away from the tape. Polymeric compound 234 is selected to have a coefficient of thermal expansion (CTE) approaching the CTE of the semiconductor chips. For many compounds, the compliant material is cured at elevated temperatures. As a result, each chip is embedded in a hybrid container, which is composed alternatively by metallic and polymeric portions.

In process 204, polymeric compound 234 is thinned down uniformly until the solderable surfaces 130a of the metallic pieces are exposed. Since, as mentioned above, the second height of the metallic pieces is greater than the first height of the chips, the thinning process leaves the rear surfaces 101c of the chips covered by lamination material. The surface 120c of the material has a coplanar surface with the solderable surfaces 130a of the metallic pieces. The removal process of thinning down is selected from a group including the processes of grinding or leveling, and plasma thinning. Polymeric compound 234 operates as a container 120 for chip 101.

In process 205, the hybrid panel with alternating metallic and polymeric portions and embedded chips is turned over so that the adhesive tape 200 is facing upward and can be removed; chip surface 101b with the chip terminals 102 and the MEMS 103, and the piece pillars 231 are now exposed for further processing.

For the process 206, the panel is transferred to the vacuum and plasma chamber of a sputtering equipment. The new panel surface is plasma cleaned, while the panel is cooled, preferably below ambient temperature. The plasma accomplishes, besides cleaning the surface from adsorbed films, especially water monolayers, some roughening of the surfaces; both effects enhance the adhesion of the sputtered metal layer. Then, at uniform energy and rate and while the panel is cooled, at least one layer 240 of metal is sputtered onto the exposed chip, metal pillars, and lamination surfaces. The sputtered layer 240 is adhering to the multiple surfaces by energized atoms that penetrate the top surface of the various materials. The metal of the at least one sputtered layer is preferably a refractory metal; the metal may be selected from a group including titanium, tungsten, tantalum, zirconium, chromium, molybdenum, and alloys thereof. It is preferred that without delay, an additional second layer is sputtered. The metal of the second layer is selected form a group including copper, silver, gold, and alloys thereof; the second layer is adhering to the first layer. The sputtered layers have the uniformity, strong adhesion, and low resistivity needed to serve, after patterning, as conductive traces for rerouting; the sputtered layers may also serve as seed metal for plated thicker metal layers of the next process.

In order to start the patterning process for redistribution traces, a photoresist film 250 is deposited on the metal seed layer across the complete panel (see process 207 in FIG. 2B). In process 208 of FIG. 2B, the photoresist film is patterned and developed in order to define windows in the photoresist film for creating a network of redistribution traces connecting chip terminals 102 to respective pieces 231. In the photoresist development process, film portions are preserved, which extend over areas selected to cover the seed metal over the respective MEMS 103.

In process 209, a layer 241 of a second metal is plated onto the first seed metal in the opened network windows; a preferred metal is copper, other options include silver, gold, and alloys thereof. It is preferred that the plated layer 241 is thicker than seed layer 240. In the next process 210, the photoresist film 241 is stripped, and in process 211, the underlying seed layer 240 is removed from the freshly opened areas. As a consequence, the MEMS 103 (in the exemplary devices, the humidity sensors) of the semiconductor chips are exposed. On the other hand, the MEMS and chip terminals 102 are now connected by redistribution layer 140 to the pillars 231 of the metallic pieces 230.

In the next process 212, a layer 110 of protective insulating stiffener is laminated over the complete grid area including the surfaces of the chips with the MEMS. A preferred material is an insulator such as the so-called solder stop material. In the next process 213, cavities 110a are opened in the stiffener layer in order to expose the MEMS of each chip, while leaving the stiffener layer 110 un-opened over the remainder of the surface of each chip. Consequently, the un-opened layer 110 encapsulates, in conjunction with container 120, the chip 101, which is thus embedded in the package while the cavity in layer 110 exposes the MEMS.

In the final process 214, the stiffener-protected hybrid metal/polymer panel with the metallic pieces is diced along lines 290 in order to singulate discrete devices by cutting the metallic pieces into equal and symmetrical halves. These halves are sometimes referred to as members. Each discrete device includes a chip and a plurality of metallic piece halves, or members, as terminals embedded in a hybrid metal/stiffener substrate. Stiffener with cavity, container of insulating polymer, and embedded terminals operate as package for the chip with the MEMS; the package includes a window in the protective stiffener for operating the MEMS, for instance as a sensor.

It is a technical advantage that the process flow for embedding the chip with the MEMS in a package incidentally also creates the cavity for accessing the MEMS. It is an additional technical advantage that the chip-embedding technology allows dramatic scaling of package as well as cavity. As an example, devices having the MEMS formed as a humidity sensor may exhibit a footprint of only 2.33×2.28 mm instead to 3.0×3.0 mm needed for humidity sensors in conventionally molded packages. In addition, the process flow allows a reduction of the package thickness from 0.75 mm to 0.29 mm.

Figure 3A:
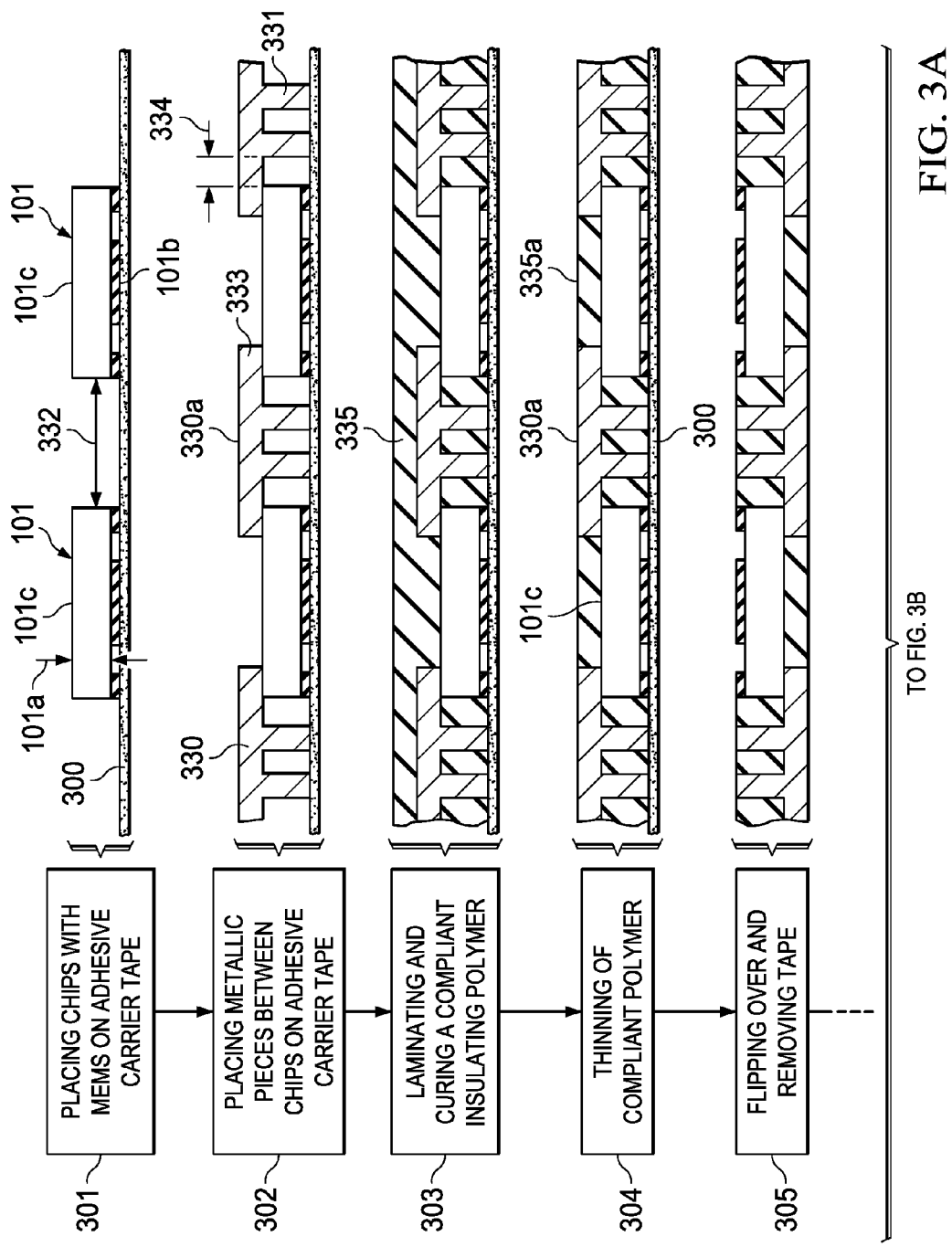
FIG. 3A depicts certain processes of another fabrication flow to embed semiconductor chips with sensor systems or MEMS in encapsulating packages having a cavity for accessing the systems.

Another embodiment of the invention is another method for fabricating open cavity packages with embedded semiconductor chips in panel format. Certain processes of this fabrication method are illustrated in FIGS. 3A, 3B, and 3C. The method starts by providing a plurality of semiconductor chips 101, which have a first height 101a and a first surface 101b. First surface 101b includes a micro-electro-mechanical system (MEMS) 103 and a plurality of terminals 102. In process 301, an adhesive carrier tape 300 is provided and the chips are placed with MEMS and terminals facing downward onto the tape 300 so that the chips are positioned in orderly rows and columns to form a regular grid and are spaced by openings 332, which are sized to accommodate metallic pieces (see below). The finished grid covers a whole area of the tape.

Furthermore, a plurality of metallic pieces 330 is provided, which are preferably made of copper. These pieces are shaped so that they have a flat pad, one or more vertical entities 331 such as pillars or hexahedrons positioned symmetrical relative to the pad center, and protrusions 333 symmetrically positioned at both ends of the pieces. The pad center itself needs to stay clear of vertical entities, since in a later process (see below process 314, package singulation) the piece will be cut into two half portions, which may be mirror images and symmetrical and are sometimes referred to as members. Each half portion has to retain a vertical entity and a pad and is referred to herein as member. After singulation, the exemplary member of the device shown in FIG. 3A includes pillar 331 positioned in the center of pad 130; in other members, such as the exemplary device shown in FIG. 2A, a hexahedron 231 is positioned at the perimeter of pad 230. The outer surface 330a of the members, i.e. the surface opposite the pillars, is preferably solderable. The height of a member, including the thickness pad, the pad and the height of the pillar, is referred to as second height; it is greater than the first height 101a.

Rather than placing individual metallic pieces, it may be more practical to use alternative methods for creating the grid of metallic pieces. One method for fabricating the grid is to provide a window frame of a sheet metal, which may have one solderable surface, and then to form the array of pieces with pads and pillars by stamping or etching.

In the next process 302, a metallic piece 330 is placed inside each respective opening 332 between two adjacent semiconductor chips so that the pillars 331 are placed on the adhesive carrier tape 300, gaps are left between the sidewalls of the pieces and the chips, and the elongated protrusions 333 of the pieces extend across the gaps to the adjacent chips and rest on portions of the adjacent chip length. After attaching the metallic pieces to the tape, chips 101 are framed by the metallic pieces while the chip sidewalls are spaced by gaps 334 from adjacent sidewalls (pillars or hexahedrons) of the metallic pieces.

In the next process 303, a compliant insulating polymer 335 is laminated, under vacuum suction, to cohesively fill the gaps 334 between chip and metallic piece sidewalls, and to cover the chip surface 101c facing away from the tape. Polymeric compound 335 corresponds to material 234 of FIG. 2A and is selected to have a coefficient of thermal expansion (CTE) approaching the CTE of the semiconductor chips. For many compounds, the compliant material is cured at elevated temperatures. As a result, each chip is embedded in a hybrid container, which is composed alternatively by metallic and polymeric portions.

The next processes follow in content and sequence closely the processes of the flow described above for an analogous exemplary embodiment. After laminating a compliant polymer in process 303, the next process 304 involves removing (for instance by back grinding or plasma thinning) lamination material 335 uniformly until the solderable surfaces 330a of the metal pieces are exposed while the rear surfaces 101c of the chips remain covered by lamination material. By the removal process, the lamination material remaining above surface 101c obtains a surface 335a coplanar with the surfaces 330a of the metallic pieces.

In the next process 305, the hybrid metal/polymer panel with embedded chips is turned over so that the adhesive carrier tape 300 is facing up and can thus easily be removed, exposing the surfaces of chips, metal pillars, and lamination polymer. Then, in process 306, at uniform energy and rate and while the panel is cooled, at least one seed layer 340 of a first metal is sputtered onto the chips, metallic pieces, and lamination surfaces. As pointed out above, the preferred metal of the sputtered layer is a refractory metal, which adheres equally strong to the exposed different materials. It is preferred that without delay an additional metal layer is sputtered, preferably copper.

In the following processes 307 and 308, a photoresist film 350 on the seed layer is deposited, patterned and developed in order to define windows for a network of redistribution traces connecting chip terminals 102 to pillars 331 of metallic pieces while preserving the film portion extending over an area selected to cover the seed metal over the MEMS 103.

In process 309, a layer 341 of a second metal is plated onto the first seed metal 340 in the opened windows, completing the redistribution metallization. In process 310, the photoresist film 350 is stripped, and in process 311, the exposed seed metal 340 is removed. After this process, the MEMS 103 is exposed.

In process 312, a layer 110 of protective insulating stiffener over the complete grid area including the surfaces of the chips. In process 313, a plurality of cavities 110a is opened in the stiffener layer to expose the MEMS of each chip, while leaving the stiffener layer un-opened over the remainder of the surface of each chip.

Finally, in process 314, the stiffener-protected hybrid metal/polymer panel is diced along lines 390 in order to singulate discrete devices, each device including a chip 101 embedded in a hybrid metal/stiffener substrate (metal 331, polymer 335, stiffener 110) acting as package and including a window (110a) in the protective stiffener for the MEMS, the device side opposite the MEMS having solderable terminals 330.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of semiconductor chip, discrete or integrated circuit, and the material of the semiconductor chip may comprise silicon, silicon germanium, gallium arsenide, gallium nitride, or any other semiconductor or compound material used in integrated circuit manufacturing.

As another example, the invention not only applies to MEMS as humidity sensors, but also to MEMS having parts moving mechanically under the influence of an energy flow (acoustic, thermal, or optical), a temperature or voltage difference, or an external force or torque. Certain MEMS with a membrane, plate or beam can be used as a pressure sensor (for instance microphone and speaker), inertial sensor (for instance accelerometer), or capacitive sensor (for instance strain gauge and RF switch); other MEMS operate as movement sensors for displacement or tilt; bimetal membranes work as temperature sensors.

It is therefore intended that the appended claims encompass any such modifications or embodiment.

We claim:

1. A method for fabricating packaged semiconductor devices comprising:
    forming metallic pieces on semiconductor chips, each semiconductor chip having a first height and a first surface including a sensor system, terminals, and sidewalls, the metallic pieces having a second height greater than the first height, each metallic piece comprising a flat pad having vertical pillars on the flat pad, a flat pad surface opposite the vertical pillars being solderable;
    placing the vertical pillars on an adhesive carrier tape to form a grid of metallic pieces, the metallic pieces spaced by openings;
    placing each semiconductor chip inside each opening, each semiconductor chip having the sensor system and the terminals facing downward and the sidewalls spaced by gaps from a sidewall of an adjacent metallic piece;
    filling the gaps between each semiconductor chip and the sidewall of the adjacent metallic piece with an insulating polymer, the insulating polymer covering a second surface of the semiconductor chip facing away from the adhesive carrier tape;
    removing the adhesive carrier tape;
    sputtering a seed layer of a first metal adhering to the first surfaces of each semiconductor chip, metallic pieces, and the insulating polymer;
    depositing, patterning and developing a photoresist film on the seed layer to define windows for a network of redistribution traces connecting the terminals to respective metallic pieces while preserving a portion of the photoresist film extending over an area of the seed layer of the first metal;
    plating a layer of a second metal onto the seed layer of the first metal windows;
    stripping the photoresist film and removing the first and second seed metals beneath the photoresist film;
    forming a layer of insulating stiffener over the grid including the first surfaces of the semiconductor chips; and
    opening a cavity in the layer of insulating stiffener to expose the sensor system of each semiconductor chip.

2. The method of claim 1 further including the process of singulating discrete devices by cutting the metallic pieces into equal and symmetrical halves.

3. The method of claim 1 further including, after the process of laminating using the insulating polymer, the process of curing the insulating polymer.

4. The method of claim 1 further including, before the process of sputtering, a process of plasma-cleaning the first surfaces of the semiconductor chips, lamination material, and metallic pieces.

5. The method of claim 1, wherein the first metal includes one of a titanium, tungsten, tantalum, zirconium, chromium, molybdenum, and alloys thereof and the second metal includes one of a copper, silver, gold, and alloys thereof.

6. The method of claim 1, wherein the sensor system and the terminals of the semiconductor chips are covered by a coat of insulating inert polymer, the coat having openings to expose the sensor system and the terminals.

7. The method of claim 1 wherein the sensor system is selected from a group including environmental sensors for humidity, temperature, pressure, chemical, magnetic, and biological detection.

8. The method of claim 1, wherein the sensor system is selected from a group including micro-electro-mechanical systems (MEMS) for environmental, mechanical, thermal, chemical, radiant, magnetic and biological inputs.

9. The method of claim 1 comprising removing the insulating polymer until the flat pad surfaces are exposed while the second surfaces of each semiconductor chip remain covered by the insulating polymer having a surface coplanar with the pad surfaces.

10. The method of claim 9, wherein the process of removing the insulating polymer is selected from a group including the processes of grinding and plasma thinning.

11. A method for fabricating packaged semiconductor devices comprising:
    placing semiconductor chips onto an adhesive carrier tape and arranging the semiconductor chips in orderly rows and columns spaced by openings, each semiconductor chip having a first height, a first surface, and sidewalls, the first surface including a sensor system and terminals;
    placing a grid of metallic pieces onto the adhesive carrier tape, the metallic pieces having a second height greater than the first height and are sized to fit in the openings while leaving gaps between sidewalls of the metallic pieces and the sidewalls of the semiconductor chips, the metallic pieces further having elongated protrusions extending across the gaps;
    filling the gaps between each semiconductor chip and the sidewall of the adjacent metallic piece with an insulating polymer, the insulating polymer covering a second surface of the semiconductor chip facing away from the adhesive carrier tape;
    removing the insulating polymer until surfaces of the metallic pieces are exposed while the second surfaces of each semiconductor chip remains covered by the insulating polymer, the insulating polymer having a surface coplanar with the surfaces of the metallic pieces;
    removing the adhesive carrier tape;

sputtering a seed layer of a first metal adhering to the first surface of each semiconductor chip, metallic pieces, and the insulating polymer;

depositing, patterning and developing a photoresist film on the seed layer to define windows for a network of redistribution traces connecting the terminals to metallic pieces while preserving a portion of the photoresist film extending over an area of the seed layer of the first metal;

plating a layer of a second metal onto the seed layer of the first metal in the windows;

exposing a portion of the first and second seed metals by stripping the photoresist film and removing the first and second metals that are exposed;

forming a layer of insulating stiffener over the grid including the first surfaces of the semiconductor chips; and opening a cavity in the layer of insulating stiffener to expose the sensor system of each semiconductor chip.

12. The method of claim 11 further including the process of singulating discrete devices by dicing the insulating stiffener.

13. The method of claim 11 further including, before the process of sputtering, a process of plasma-cleaning, the first surfaces of semiconductor chips, insulating polymer, and metallic pieces.

14. The method of claim 11, wherein the sensor system and the terminals of the semiconductor chips are covered by a coat of insulating inert polymer, the coat having openings to expose the sensor system and the terminals.

15. An open cavity package comprising:
  a semiconductor chip having a first surface including a sensor system metallized terminals, a second surface parallel to the first surface, and sidewalls;
  a container of insulating polymeric material adhering to the second surface and the sidewalls of the chip, the container including a third surface, and a fourth surface substantially parallel to the second surface; and
  a plurality of metallic pads in the insulating polymeric material, the metallic pads having a flat outer surface, and an inner pillar positioned on the plurality of metallic pads and contacting conductive redistribution traces to the metallized terminals, the flat outer surface extending from the inner pillar to under the semiconductor chip as projected perpendicularly onto the flat outer surface, each of the plurality of metallic pads extending from the second surface of the semiconductor chip in a direction of the fourth surface, the flat outer surface being exposed from the open cavity package.

16. The package of claim 15, wherein the sensor system is selected from a group including sensors for humidity, temperature, pressure, chemical, magnetic, and biological detection.

17. The package of claim 15, wherein the sensor system is selected from a group including micro-electro-mechanical systems (MEMS) for environmental, mechanical, thermal, chemical, radiant, magnetic and biological inputs.

18. The package of claim 15 further comprising:
  a layer of insulating stiffener on the first and third surfaces and the redistribution traces; and
  a cavity in the layer of insulating stiffener exposing the sensor system.

19. The package of claim 15, wherein the inner pillar is positioned vertically on the pad.

20. The package of claim 15, wherein the plurality of metallic pads is along a perimeter of the package.

* * * * *